(12) United States Patent
Gaynor et al.

(10) Patent No.: US 9,300,286 B2
(45) Date of Patent: Mar. 29, 2016

(54) ANTENNA TRANSMIT RECEIVE SWITCH

(71) Applicant: PEREGRINE SEMICONDUCTOR CORPORATION, San Diego, CA (US)

(72) Inventors: Michael P. Gaynor, Crystal Lake, IL (US); Dan William Nobbe, Crystal Lake, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 323 days.

(21) Appl. No.: 14/040,471

(22) Filed: Sep. 27, 2013

(65) Prior Publication Data

US 2015/0091776 A1 Apr. 2, 2015

(51) Int. Cl.
| | |
|---|---|
| *H04B 1/44* | (2006.01) |
| *H04B 1/46* | (2006.01) |
| *H04B 1/40* | (2015.01) |
| *H03K 17/693* | (2006.01) |
| *H04B 1/04* | (2006.01) |
| *H04B 1/18* | (2006.01) |
| *H04B 1/48* | (2006.01) |

(52) U.S. Cl.
CPC ............ *H03K 17/693* (2013.01); *H04B 1/0458* (2013.01); *H04B 1/18* (2013.01); *H04B 1/48* (2013.01)

(58) Field of Classification Search
CPC .............. H04B 1/44; H04B 1/48; H04B 1/56; H04B 1/0458; H04B 1/18
USPC ................................ 455/78–83, 120–129, 87
See application file for complete search history.

(56) References Cited

U.S. PATENT DOCUMENTS

| | | | | |
|---|---|---|---|---|
| 6,795,714 | B1 * | 9/2004 | Fickenscher | H04B 1/005 455/180.1 |
| 7,127,216 | B2 * | 10/2006 | Frank | H04B 1/44 455/127.4 |
| 7,248,120 | B2 | 7/2007 | Burgener et al. | |
| 7,910,993 | B2 | 3/2011 | Brindle et al. | |
| 8,129,787 | B2 | 3/2012 | Brindle et al. | |
| 8,803,632 | B2 * | 8/2014 | Takeuchi | H03H 7/38 333/101 |
| 2004/0239442 | A1 * | 12/2004 | Wilcox | H04B 1/005 333/126 |
| 2005/0287976 | A1 * | 12/2005 | Burgener | H03F 1/223 455/333 |
| 2007/0222697 | A1 * | 9/2007 | Caimi | H01Q 1/243 343/861 |
| 2007/0232241 | A1 * | 10/2007 | Carley | H04B 1/48 455/83 |
| 2009/0298443 | A1 * | 12/2009 | Ta | H04B 1/48 455/83 |
| 2011/0165849 | A1 * | 7/2011 | Gorbachov | H04B 1/48 455/84 |

(Continued)

FOREIGN PATENT DOCUMENTS

WO 2009108391 9/2009

OTHER PUBLICATIONS

Cory, et al. "Solid State RF/Microwave Switch Technology: Part 2" MP Digest, Jun. 2009, pp. 34, 38, 60, 62, and 66.

*Primary Examiner* — Simon Nguyen
(74) *Attorney, Agent, or Firm* — Jaquez Land Richman LLP; Martin J. Jaquez, Esq.; Alessandro Steinfl, Esq.

(57) ABSTRACT

An antenna switch is presented. The antenna switch can connect an antenna to either transmit circuitry or receive circuitry, depending on control signals applied to the antenna switch while presenting different impedances to a connected circuitry.

54 Claims, 18 Drawing Sheets

(56) References Cited

U.S. PATENT DOCUMENTS

| | | |
|---|---|---|
| 2013/0222075 A1 | 8/2013 | Reedy et al. |
| 2013/0325149 A1* | 12/2013 | Manssen .............. G05B 13/02 700/37 |
| 2014/0112213 A1* | 4/2014 | Norholm ................ H04B 1/56 370/277 |
| 2014/0266455 A1 | 9/2014 | Kaatz et al. |
| 2015/0048898 A1 | 2/2015 | Gaynor |
| 2015/0054594 A1* | 2/2015 | Apriyana .............. H03H 11/30 333/103 |

* cited by examiner

ANTENNA TRANSMIT RECEIVE SWITCH

BACKGROUND

1. Field

The present application relates to switches. More particularly, the present application relates to an antenna transmit receive switch.

2. Description of Related Art

A wireless device such as a cellular phone will typically use one antenna for both transmitting and receiving. During periods of time when the wireless device is receiving, one or more switches in the wireless device can be utilized to connect the antenna to receive circuitry and disconnect the antenna from transmit circuitry. During periods of time when the wireless device is transmitting, the switches can be utilized to connect the antenna to transmit circuitry and disconnect the antenna from receive circuitry. The receive circuitry, transmit circuitry, and antenna normally do not all share the same impedance value.

Generally, when connecting two circuit elements with different impedance values, impedance matching networks are used to transform an impedance of a first circuit element to an impedance of a second circuit element in order to reduce or eliminate power loss due to reflection and optimize power transfer between the first circuit element and the second circuit element. Consequently, in the exemplary case of a wireless device, impedances of the receive circuitry, transmit circuitry, and antenna usually are transformed to a common system impedance when connected via the switches.

A commonly used value for system impedance in wireless design is 50Ω. Consequently, as an example, consider an impedance matching network that is adapted to transform an impedance to the system impedance of 50Ω. Receive circuitry typically has an impedance close to or equal to the system impedance of 50Ω, resulting in little or no power loss in the impedance matching network. The transmit circuitry and antenna usually have low impedance values relative to the system impedance of 50Ω. For example, a power amplifier of the transmit circuitry can have an output impedance of 2Ω whereas an antenna can have an impedance of 10Ω to 20Ω. Impedance transformation from such impedance values to 50Ω can result in nontrivial power loss. It is noted that each of the transmit circuitry, receive circuitry, and antenna can also contain a reactive component in its impedance.

SUMMARY

According to a first aspect of the present disclosure, a circuital arrangement is presented, comprising: a first port; a second port; a third port; a first transistor arrangement; a second transistor arrangement; a first reactive element; and a control signal; wherein the circuital arrangement is configured to operate in one of a first mode and a second mode of operation, a mode of operation being determined by the control signal, wherein: during the first mode of operation, the circuital arrangement is configured to present a first impedance at the first port and a second impedance at the second port and to provide a first electrical conduction path between the second port and the first port through the first transistor arrangement, while isolating the third port from the first electrical conduction path; and during the second mode of operation, the circuital arrangement is configured to present the first impedance at the first port and a third impedance different from the first impedance and the second impedance at the third port and provide a second electrical conduction path between the third port and the first port through the second transistor arrangement connected in series with the first reactive element, while isolating the second port from the second electrical conduction path.

According to a second aspect of the present disclosure, a circuital arrangement is presented, comprising: one or more first port; one or more second port; one or more third port; one or more first transistor arrangement; one or more second transistor arrangement; a first reactive element; and a control signal; wherein the circuital arrangement is configured to operate in one or both of a first mode and a second mode of operation, wherein: during the first mode of operation, the circuital arrangement is configured to present a first impedance at a selected first port from among the one or more first ports and a second impedance at a selected second port from among the one or more second ports, and provide a first electrical conduction path between the selected second port and the selected first port through a first transistor arrangement of the one or more first transistor arrangements, while isolating the one or more third port and the unselected one or more first and second port from the first electrical conduction path; and during the second mode of operation, the circuital arrangement is configured to present the first impedance at a selected first port from among the one or more first ports and a third impedance at a selected third port from among the one or more third ports, and provide a second electrical conduction path between the selected third port and the selected first port through a second transistor arrangement of the one or more second transistor arrangements connected in series with the first reactive element, while isolating the one or more second port and the unselected one or more first and third port from the second electrical conduction path; wherein the first or second modes of operation and the selected first port among the one or more first ports, the selected second port among the one or more second ports and the selected third port among the one or more third ports are selected by the control signal generated from a control unit.

According to a third aspect of the present disclosure, a method for reducing loss in a radio frequency circuit is presented, the method comprising: during a first RF signal flow, providing a first conduction path between a corresponding first circuit and an antenna match circuit while isolating a second circuit from the first conduction path; during a second RF signal flow, providing a second conduction path between the corresponding second circuit and the antenna match circuit while isolating the first circuit from the second conduction path; based on the providing of the first conduction path, presenting a first impedance to both the first circuit and the antenna match circuit, and based on the providing of the second conduction path, presenting a second impedance to the second circuit and the first impedance to the antenna match circuit, wherein the first impedance value is smaller than the second impedance value.

BRIEF DESCRIPTION OF THE DRAWINGS

The accompanying drawings, which are incorporated into and constitute a part of this specification, illustrate one or more embodiments of the present disclosure and, together with the description of example embodiments, serve to describe the principles and implementations of the disclosure. Like reference numerals indicate corresponding parts in the various figures.

DETAILED DESCRIPTION

As used herein, the term "system impedance" can refer to a common impedance value to which individual components of a system are transformed.

The present disclosure provides an exemplary case of an antenna switch using at least two different system impedances (e.g. one each for transmitting and receiving) in order to minimize loss. According to further embodiments of the present disclosure, the antenna switch can use three different system impedances, one each for transmitting, receiving and the antenna. As used herein, a "receive case" can refer to periods when a device is receiving, and a signal received by an antenna of the device can propagate to receive circuitry through the antenna switch. A "transmit case" can refer to periods when the device is transmitting, and a signal from transmit circuitry can propagate to the antenna of the device through the antenna switch for further transmission.

Impedance transformation between different impedance values can result in loss (e.g. signal power loss) within an impedance matching network. In general, a larger difference in impedance values between two different circuit arrangements can result in a larger loss (e.g. insertion loss or loss due to reflection) within the impedance matching network. A conventional antenna switch normally uses one system impedance (e.g. 50Ω) when both transmitting and receiving. Although the transmit circuitry and antenna can have low impedances relative to a standard system impedance of, for example, 50Ω, and would thus tend to favor transformation to a lower system impedance when connecting the transmit circuitry to the antenna, transforming to too low a system impedance can result in excessive loss within the antenna switch. As will be described in detail later in the present disclosure, switching between transmit and receive cases can be performed through operation of switching devices, such as FETs (field effect transistors), inside the antenna switch, where ON resistance of the switching devices can lead to not insignificant loss when serving as a series connection between two low impedances (e.g. transmit circuitry and antenna).

Figure 1A:
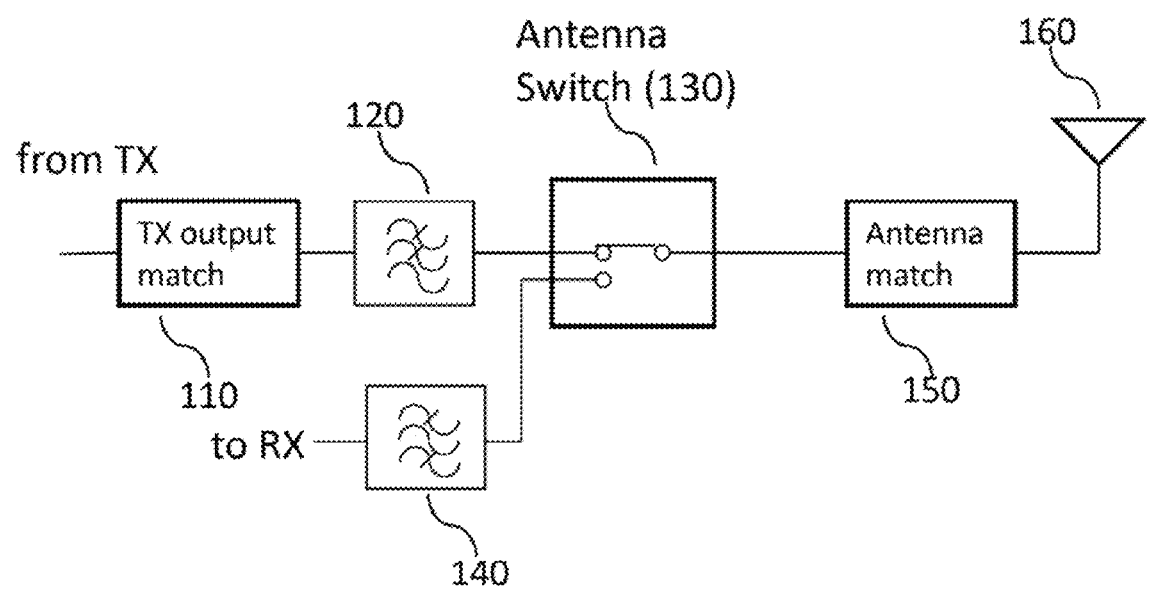
FIG. 1A shows a block diagram of an exemplary antenna switch and its connected components according to an embodiment of the present disclosure. The antenna switch can be configured to connect an antenna matching network between either a transmit circuitry or a receive circuitry.

In accordance with the present disclosure, FIG. 1A shows a block diagram of an exemplary antenna switch (130) and its connected components according to an embodiment of the present disclosure. The antenna switch (130) is capable of switching an antenna matching network (150) between either a transmit circuitry filter (120) or a receive circuitry filter (140). Transmit circuitry, which usually includes a power amplifier in a final stage, can be connected to a transmit circuitry match (110) that can in turn be connected to the transmit circuitry filter (120). Receive circuitry (e.g. a low noise amplifier followed by a demodulator) can be connected to the receive circuitry filter (140). In the example embodiment shown in FIG. 1A, the transmit circuitry filter (120) is a low-pass filter designed to reduce harmonics from the transmit circuitry, and the receive circuitry filter (140) is a band-pass filter designed to reject signals at an image frequency and other spurious frequencies.

By way of example and not of limitation, the transmit circuitry match (110) can comprise a fixed impedance matching network or a tunable impedance matching network. In some embodiments, the antenna matching network can comprise a fixed impedance matching network or a tunable impedance matching network. A fixed impedance matching network can be designed using standard techniques that are known to a person skilled in the art and can be implemented as, for example, an L-match, a cascade of L-matches, a Pi-network, and/or a T-network. Examples of tunable impedance matching networks are described, for example, in U.S. patent application Ser. No. 13/967,866, entitled "Tunable Impedance Matching Network", filed on Aug. 15$^{th}$ 2013, which is incorporated by reference herein in its entirety.

According to further embodiments of the present disclosure and with continued reference to FIG. 1A, the transmit circuitry match (110) can comprise even and/or odd harmonic termination, such as to enhance certain harmonics (e.g. odd harmonics) and/or attenuate certain harmonics of a signal to be transmitted, for improved linearity and efficiency of the transmit circuitry. Such harmonic shorts and/or harmonic opens may be variable/configurable harmonic terminations, configured, for example, to adapt output/final stage of the amplifier to different modes and frequency bands via the variable components of the transmit circuitry match (110). More information on variable harmonic terminations can be found in, for example, U.S. patent application Ser. No. 13/797,686, entitled "Variable Impedance Match and Variable Harmonic Terminations for Different Modes and Frequency Bands", filed on Mar. 12$^{th}$ 2013, which is incorporated herein by reference in its entirety.

Figure 1B:
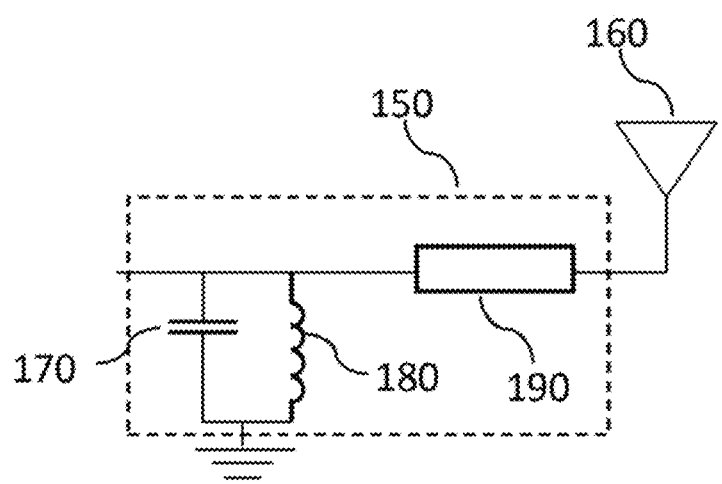
FIG. 1B shows an example embodiment of an antenna matching network.

According to an example embodiment of the present disclosure, FIG. 1B shows an example embodiment of the antenna matching network (150) of FIG. 1A. In the example embodiment shown in FIG. 1B, the antenna matching network (150) comprises a transmission line (190) with a shunt-connected capacitor (170) and a shunt-connected inductor (180). The transmission line (190) can rotate impedances on the Smith Chart about the transmission line's characteristic impedance. For example, a 50Ω transmission line will rotate the impedance in a circle about the center of the chart, where in this case, the center of the chart is 50Ω. As a further example, in case of a low impedance, a 50Ω transmission line will rotate the low impedance until a conductance of 1/50 is achieved, thus allowing a 50Ω match to be achieved with a shunt reactance. The shunt-connected capacitor (170) and the shunt-connected inductor (180) can complete the impedance match by adding this reactance.

As indicated previously, in accordance with the several example embodiments of the present disclosure, the transmit circuitry and antenna can have low impedances relative to a standard system impedance of, for example, 50Ω. Therefore, instead of transforming impedance of a transmit circuitry, and an antenna to a system impedance of 50Ω, simulation results have shown that transforming impedances of the transmit circuitry and antenna to a system impedance less than 50Ω can reduce power loss in corresponding impedance matching networks.

Figure 1C:
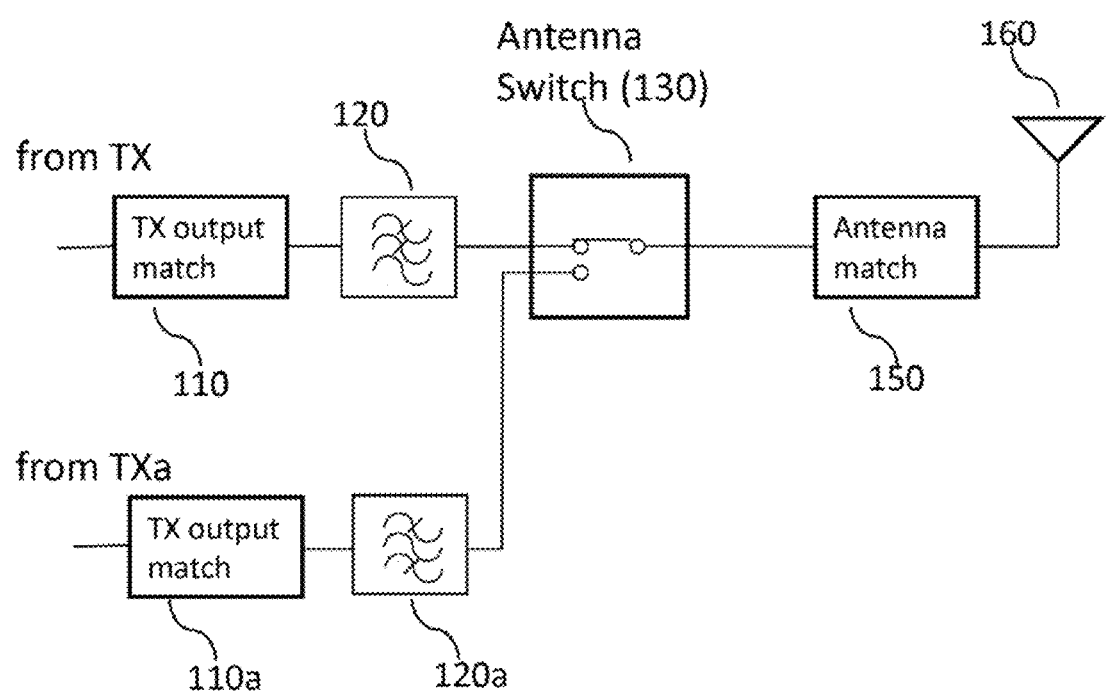
FIG. 1C shows an alternative embodiment of the embodiment presented in FIG. 1A, wherein the antenna switch connects the antenna matching network to one of two transmit circuits.

Although in the exemplary embodiment of the present disclosure shown in FIG. 1A the antenna switch (130) switches the antenna circuit (150, 160) between a transmit circuit (110, 120) and a receive circuit (140), according to further embodiments of the present disclosure, the antenna switch (130) can switch two transmit circuits with different impedance matching requirements to the antenna circuit. Such embodiment is shown in FIG. 1C, wherein a second transmit circuit (110a, 120a) is connected to the antenna switch (130). The second transmit circuit can have a transmit filter circuit (120a) which has a different (e.g. higher) output impedance than the output impedance of the first transmit filter circuit (120). The antenna switch (130) can transform output impedance of the transmit filter circuit (120a) to the antenna impedance. The skilled person will realize that such impedance transformation equally impacts the voltage level of a signal passed through the switch, for example, the signal at the lower impedance port of the switch will have a lower voltage than the signal at the higher impedance port of the switch. The ratio of the two voltages being the ratio (e.g. approximately, as one should also factor in the insertion loss of the switch) of the two impedances at the two ports. According to some embodiments of the present disclosure, switching elements (e.g. transistor switches as described later in the disclosure) inside the antenna switch are designed to withstand such difference in voltages at the different ports of the switch. For example, in the case of a stacked transistor switches at two ports with differing impedances, the stack height of a stacked transistor switch at a lower impedance port can be proportional to the stack height of a stacked transistor switch at a higher impedance port. According to some embodiments of the present disclosure such proportion can be the ratio between the impedances at the two ports of the switch.

Figure 2:
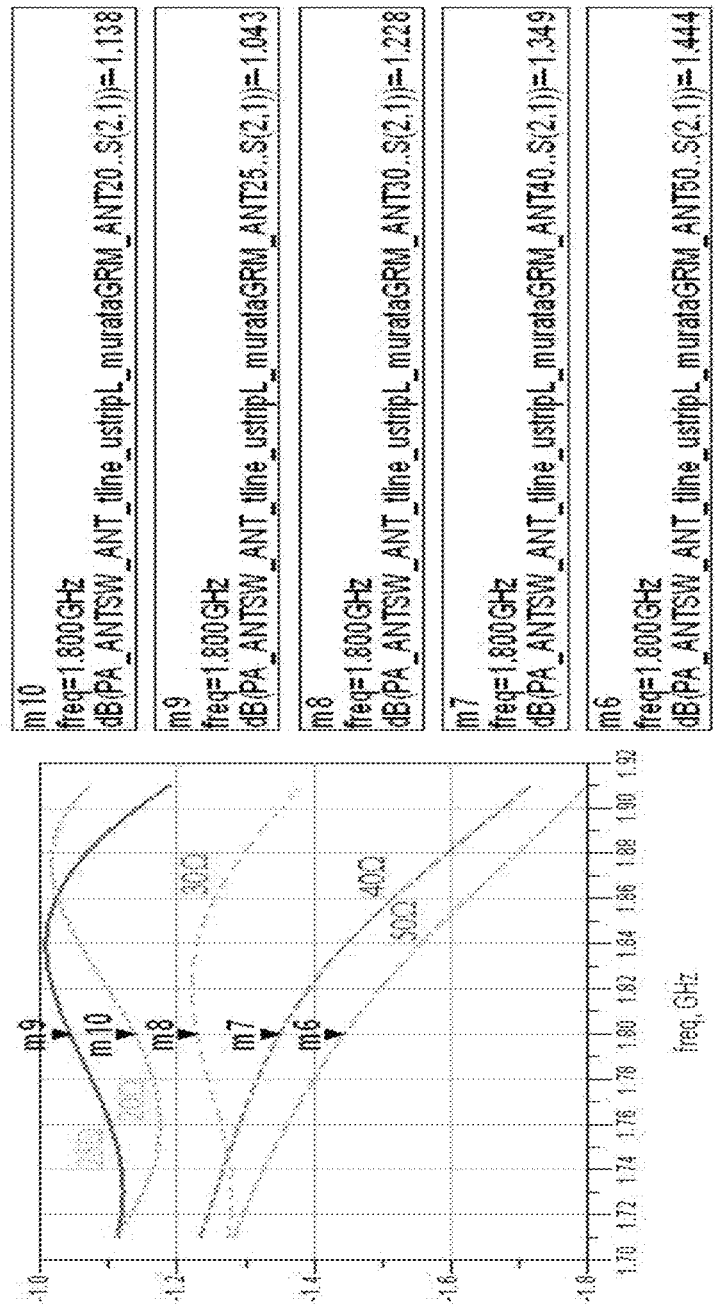
FIG. 2 shows a comparison of insertion loss for different values of system impedance when an antenna switch is connecting the transmit circuitry and the antenna.

As an example of simulation results, FIG. 2 shows a comparison of insertion loss for different values of system impedance when an exemplary antenna switch is in a transmit case (i.e. the antenna switch is providing a connection between transmit circuitry and an antenna). The exemplary simulation result of FIG. 2 shows that a system impedance of less than 50Ω can reduce loss for the transmit case. For example, as shown in FIG. 2, a system impedance of 25Ω for the transmit case can reduce power loss in corresponding impedance matching networks by a total of approximately 0.4 dB @1.8 GHz. Consequently, for the exemplary system whose results are shown in FIG. 2, a system impedance of 25Ω can serve as a compromise that will not result in excessive loss in a single component from an antenna switch, an antenna matching network, or a matching network connected to the transmit circuitry. As previously mentioned, however, impedance of the transmit circuitry and antenna cannot be transformed to too low a value, such as 5Ω or lower, since in such cases, loss due to an ON resistance of an antenna switch connecting the transmit circuitry and the antenna can become larger than expected.

Figure 3:
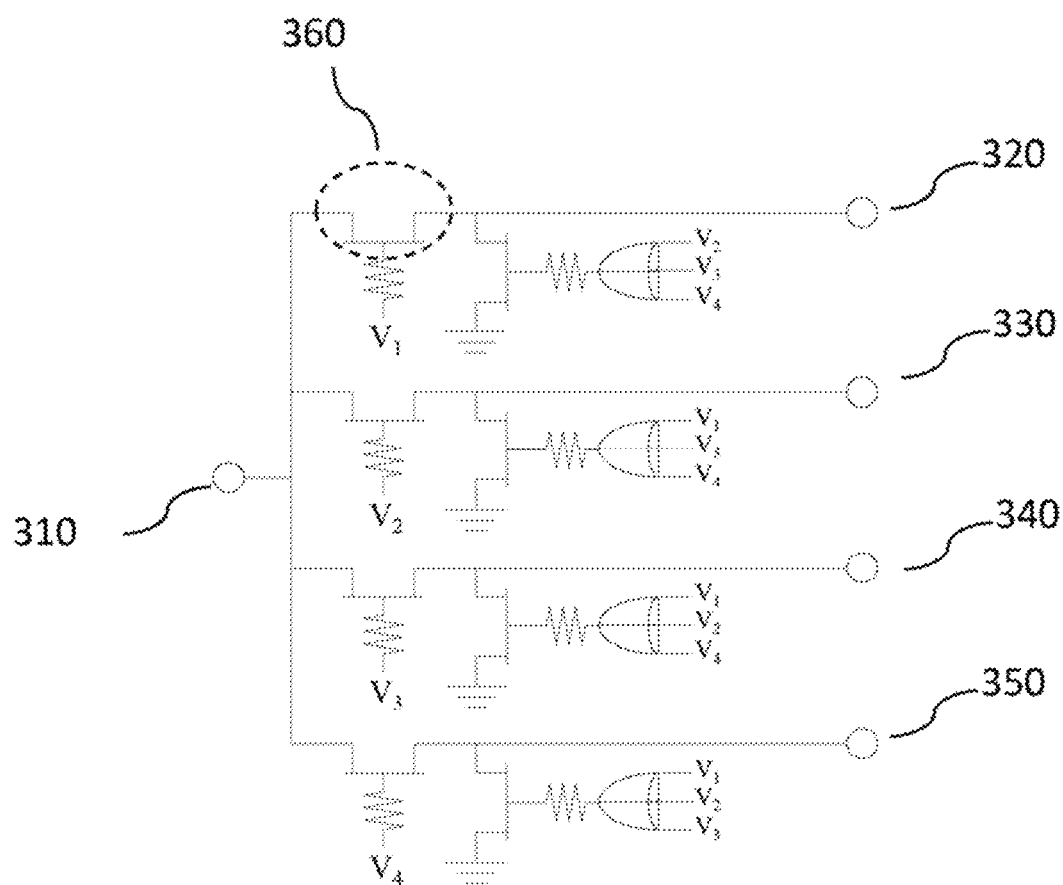
FIG. 3 shows an example antenna switch.

According to an exemplary embodiment of the present disclosure, FIG. 3 shows the exemplary antenna switch (130) of FIG. 1A comprising a plurality of MOSFET switches. In the exemplary embodiment of FIG. 3A, the MOSFET switches are arranged and operated in a manner to selectively connect the antenna matching network (150) to either the transmit circuitry filter (120) or the receive circuitry filter (140) for transmit or receive operations, respectively. In the exemplary antenna switch (130), a terminal (310) can be connected to an antenna or antenna match (not shown) while terminals (320, 330, 340, 350) can be connected to different circuit arrangements (e.g. transmit circuitry, receiving circuitry). The antenna switch (130) can be configured to connect one terminal from among the terminals (320, 330, 340, 350) to the terminal (310). By way of example and not of limitation, terminal (320) can be connected to transmit circuitry. If, for example, terminals (310, 320) are both at a similar impedance value, which is generally lower than the system impedance value of 50Ω, a field effect transistor (FET) (360), which can be utilized as a switching device, is in a series path between the similar impedance terminals (310, 320). In FIG. 3, $V_1$-$V_4$ represent various control signals applied to the FETs.

Figure 4A:
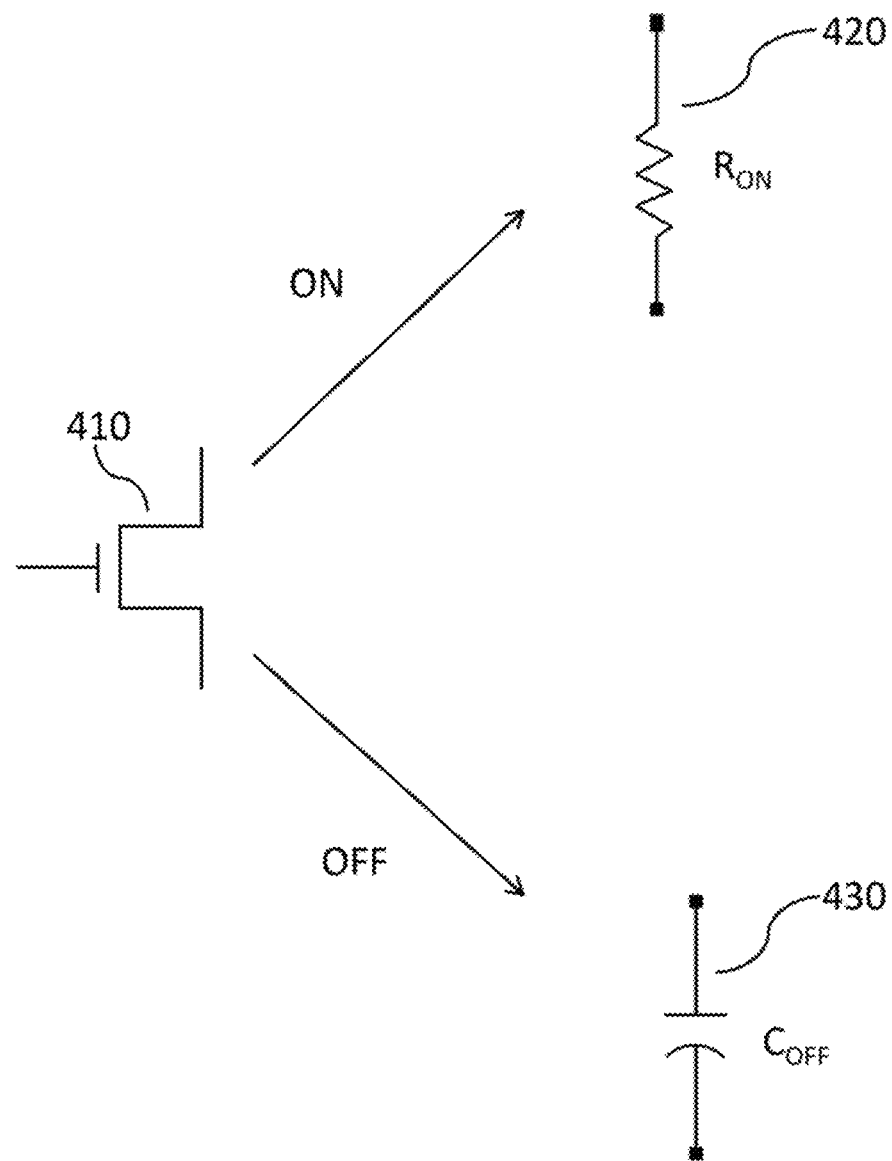
FIG. 4A shows equivalent circuit representations of a MOSFET being used as a switch in either ON or OFF states.

According to an example embodiment of present disclosure, FIG. 4A shows equivalent circuit representations of a MOSFET (410) being used as a switch in either ON (420) or OFF (430) states. When the MOSFET switch (410) is ON, the MOSFET switch (410) can be represented by an equivalent resistor (420), referred to as an ON resistance, with a value $R_{ON}$. When the MOSFET switch (410) is OFF, the MOSFET switch (410) can be represented by an equivalent capacitor (430), referred to as an OFF capacitance, with a value $C_{OFF}$. The equivalent circuit representations for the exemplary MOSFET switch (410) in either ON or OFF states are used in equivalent circuit models, presented in FIGS. 6B-6E.

Figure 4B:
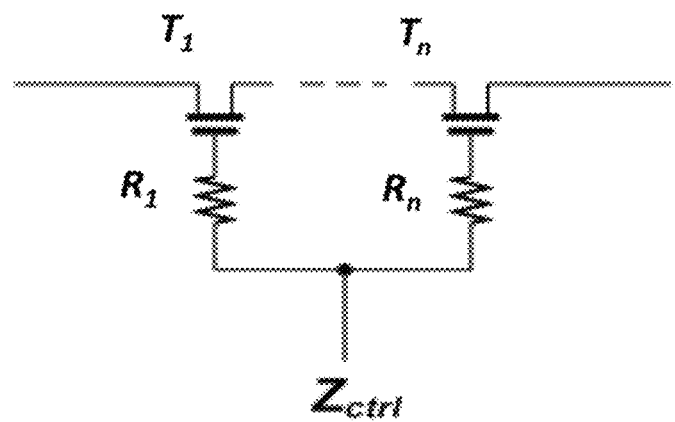
FIG. 4B shows an exemplary embodiment according to the present disclosure of a switch with stacked transistors.

According to some embodiment of the present disclosure, a switch (e.g. transistor) used in the various embodiments presented in the current disclosure can be a stacked (transistor) switch arrangement such as depicted in FIG. 4B. The stacked switch arrangement depicted in FIG. 4B allows power handling capability greater than a power handling capability of a switch comprising a single transistor, because a voltage present across a single transistor switch (e.g. when the transistor switch is in an OFF state) may be sufficiently high to damage the one transistor, as opposed to dividing the voltage across the multiple transistors of the stacked arrangement of FIG. 4B. More information on stacked transistor and switches can be found, for example, in U.S. Pat. No. 7,248, 120, issued on Jul. 24, 2007, entitled "Stacked Transistor Method and Apparatus", which is incorporated herein by reference in its entirety.

The stacked switch arrangement of FIG. 4B also provides a higher linearity (e.g. lower distortion) when combined with known design methods and improved process and integrated circuit design advancements. One such advancement comprises the so-called "HaRP™" technology enhancements developed by the assignee of the present application. The HaRP™ enhancements provide for new RF architectures and improved linearity in RF front end solutions. FETs made in accordance with the HaRP™ enhancements are described in pending applications and patents owned by the assignee of the present application. For example, FETs made in accordance with the HaRP™ enhancements are described in U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

More specifically, and as described in the aforementioned patents, FETs (e.g. FET switches) made in accordance with HaRP™ technology enhancements comprise accumulated charge control (ACC) silicon on insulator (SOI) metal-oxide-semiconductor field-effect transistors (MOSFETs), where each ACC SOI MOSFET includes an accumulated charge sink (ACS) coupled thereto which is used to remove accumulated charge from the ACC FET body when the FET (e.g. switch) operates in an accumulated charge regime. The ACS facilitates removal or otherwise controls the accumulated charge when the ACC SOI MOSFET operates in the accumulated charge regime. Thus, the HaRP™ technology enhancements provide a method and apparatus for use in improving linearity characteristics of MOSFET devices (e.g. switches) using the accumulated charge sink (ACS).

Although switches implemented using MOSFETs are discussed throughout the present disclosure, PIN diodes and MEMS (micro-electromechanical system) devices can be used as switches as well. Actual device utilized to implement switches can be dependent on application and different conditions such as power handling capacity, linearity performance, frequency of operation and voltage/current involved in switching between states. For example, PIN diodes can be useful in high power and high frequency applications, but can draw more current (e.g. 2-3 mA) than FET devices in order to switch states. As a further example, MEMS devices can be designed with good power handling capacity and linearity performance, but can involve a higher switching voltage than FETs devices.

Figure 5:
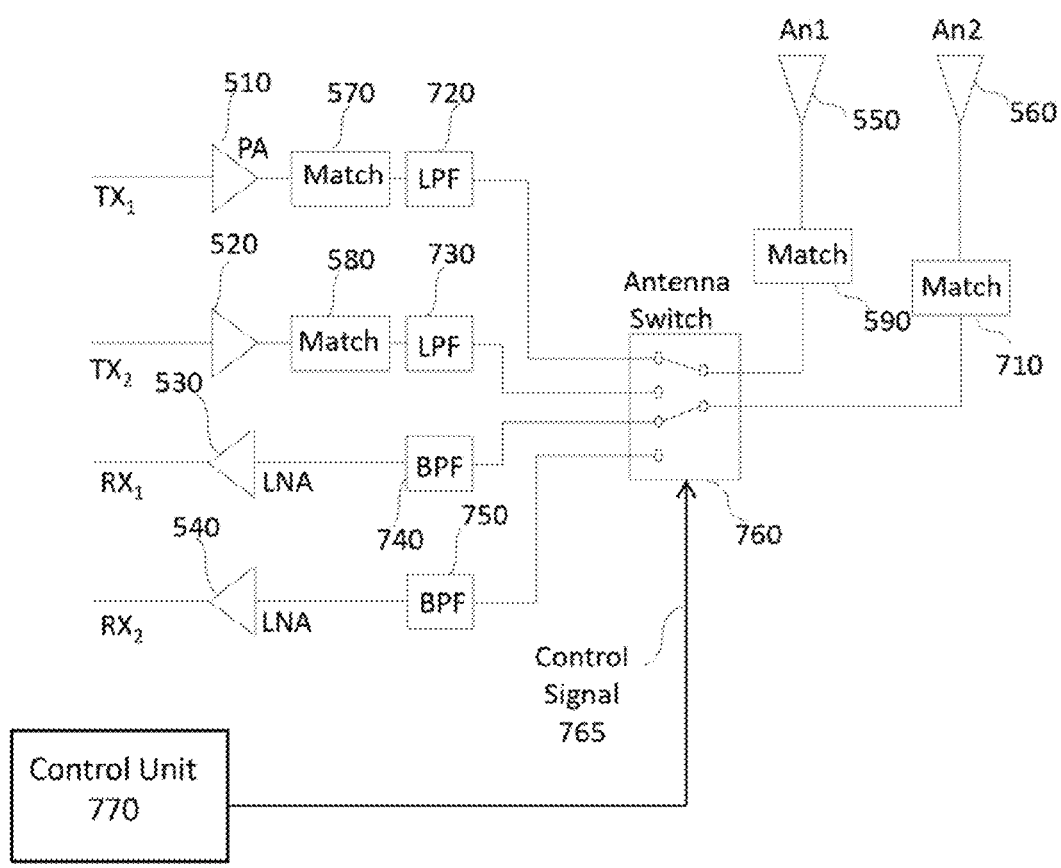
FIG. 5 shows a block diagram of an exemplary antenna transmit receive circuitry that comprises an antenna switch, a plurality of transmit paths, receive paths, and antennas as well as their connected components according to an embodiment of the present disclosure. The antenna switch can be configured to switch an antenna matching network between either one of a plurality of transmit paths or one of a plurality of receive paths.

According to many embodiments of the present disclosure, the antenna switch (130) of FIG. 1A can be configured to accommodate more than one transmit path, more than one receive path, and/or more than one antenna. For example, FIG. 5 shows an exemplary antenna transmit receive circuitry comprising, an antenna switch (760), two transmit paths (i.e. first transmit path comprising 510, 570, 720 and the second transmit path comprising 520, 580, 730), two receive paths (i.e. the first receive path comprising 740, 530 and the second receive path comprising 750, 540), and two antennas (550, 560). The number of transmit paths, receive paths, and antennas can change depending on the application.

In the exemplary embodiment of FIG. 5, the antenna switch (760) is a combination of two single pole double throw switches. In some embodiments, the antenna switch can be a dual pole multiple throw switch, or a multiple pole multiple throw switch as well. The antenna switch (760), as shown in the exemplary embodiment of FIG. 5, can simultaneously connect the two antennas (550, 560) to appropriate transmit or receive, depending on a control signal (765) fed to the switch and generated, for example, by a control unit (770). The control unit (770) can generate the control signal depending on the desired wireless protocol. For example, if the desired wireless protocol is GSM low band at 824 MHz, the control unit generates the control signal according to that protocol, such as to connect an appropriate transmit/receive path to the antenna.

In some embodiments, where more than one antenna, for example, two antennas are connected to the antenna switch, as shown in the example embodiment of FIG. 5, an algorithm can be used by a the control unit (770), to choose a specific antenna among the two antennas. This algorithm can vary depending on the application. In the example embodiment of FIG. 5, the control unit can use the algorithm to monitor the signal strength received from the base station by each of the antennas among the two antennas, and therefore choose the antenna among the two antennas, with the highest signal strength for both transmit and receive until the next time slot or in some cases the algorithm will monitor signal strength over a larger interval like every 5 or 10 time slots. In the exemplary antenna switch (760) of FIG. 5, the control signal from the control unit (770) can be a parallel signal with multiple data line or a single bit stream as defined by, for example, mobile industry processor interface (MIPI) standard.

In accordance with the several example embodiments of the present disclosure, a software/firmware of the control unit (770) can monitor a link information sent by a base station for power control, transmit and receive frequency, timing and frequency shift due to Doppler, etc. The control unit (770) can send a signal to transmit that can account for the Doppler shift as well as the correct assigned time slot from the base station. Likewise the software/firmware of the control unit (770) can do the same for the receive time slot with compensation for Doppler timing shift. Each transmit circuitry and receive circuitry in the system can be configured to transmit or receive, respectively, signals within a certain frequency band. An antenna switch (760) employed in such a system can be configured to connect the antennas (550, 560) to corresponding transmit and/or receive circuitries to transmit or receive, respectively, signals of corresponding frequency bands.

In the transmit case, with reference to FIG. 5, a signal can propagate and can be processed through a transmit circuitry. In the example embodiment of FIG. 5, the transmit circuitry can comprise of at least a power amplifier (PA) (510 or 520), a transmit circuitry impedance match (570 or 580), and a low-pass filter (720 or 730). The processed signal from the low-pass filter (720 or 730) can then be directed by an antenna switch (760) to an antenna matching network (590 or 710) and finally to an antenna (550 or 560) to be transmitted.

In the receive case, a signal from an antenna (550 or 560) can propagate and can be processed through the antenna matching network (590 or 710) to the antenna switch (760) and then directed from the antenna switch (760) to receive circuitry. In the example embodiment of FIG. 5, the receive circuitry can comprise of at least a bandpass filter (740 or 750), a low noise amplifier (LNA) (530 or 540) and a receiver.

As previously indicated, in some embodiments, number of transmit circuitries, receive circuitries, and antennas can be different from each other. Additionally, the embodiment of FIG. 5 shows multiple transmit circuitries, multiple receive circuitries, as well as multiple antennas. Increase in number of transmit paths, receive paths, or antennas can increase the insertion/power loss as well as decrease the overall system efficiency. As used herein, the term "system efficiency" can be defined as a ratio of input power to an electrical path to output power from the same electrical path.

In accordance with the present disclosure, an antenna switch can be designed to present a lower impedance (for example, 30Ω) from the standard system impedance of 50Ω to a transmit circuitry filter and an antenna matching network and present a standard system impedance of 50Ω to a receive circuitry filter. Details of how this can be accomplished will be provided below with reference to FIGS. 6A-6F.

Figure 6A:
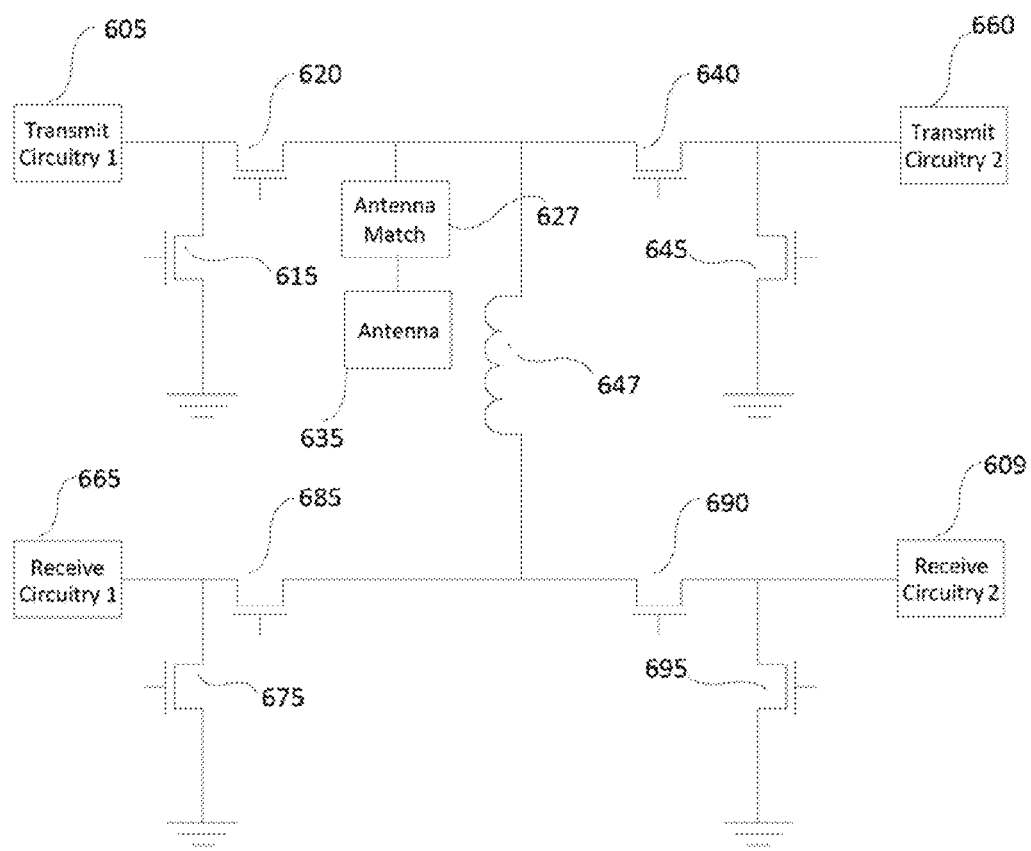
FIG. 6A shows a block diagram representation of an exemplary antenna transmit receive arrangement with a plurality of transmits and receives, wherein an inductor is used to match an impedance at the receive circuitries.

According to an exemplary embodiment of the present disclosure, FIG. 6A shows a block diagram representation of an exemplary antenna transmit receive arrangement with a plurality of transmits and receives (e.g. circuitries). The exemplary antenna transmit receive arrangement of FIG. 6A comprises a plurality of MOSFETs (615, 620, 640, 645, 675, 685, 690, 695) to switch the antenna (635) between the plurality of transmits (605, 660) and receives (665, 609), where each MOSFETs can be in an ON state or an OFF state. In FIG. 6A, FETs (620, 640, 685 and 690) can be referred to as series switches, since switches (620, 640, 685, 690), when ON, can provide a series connection between an antenna match (627) and one of the transmit circuitries (605, 660) or receive circuitries (609, 665). FETs (615, 645, 675, 695) can be referred to as shunt switches, since switches (615, 645, 675, 695), when ON, can shunt a signal to ground. In the exemplary embodiment of FIG. 6A, an inductor (647) separates the transmit circuitries (605,660) from the receive circuitries (609, 665) and can be utilized to match the impedance at the receive side (e.g. create a difference in impedance value seen by transmit and receive circuits). Although in the exemplary embodiment according to FIG. 6A an inductor (647) is used to match the impedance at the receive side, according to further embodiments of the present disclosure a reactive network, comprising a plurality of combined (e.g. series and/or shunt) reactive elements (e.g. capacitor, inductor), can be used to match the impedance at the receive side, as shown in FIG. 6F. The skilled person will understand that selection of the reactive network (647a) of FIG. 6F can depend on a desired matching value of the impedance at the receive side as well as a desired frequency of operation of the arrangement (e.g. frequency band of operation). The skilled person will also understand that the following discussions/analysis based on the small signal equivalent circuit of FIG. 6A can equally be applied to FIG. 6F, and will not be discussed in details.

The exemplary antenna transmit receive arrangement of FIG. 6A can present a first impedance value to the transmit circuitries (605, 660) and the antenna match (627) and a second impedance value to the receive circuitries (609, 665). Since, the impedance at the transmit circuitry (605) and the antenna matching network can be same, they can form a through path. The term, "through path" as used herein can refer to a direct connection between two circuit elements in a network. For example, in the exemplary embodiment of FIG. 6A, the transmit circuitry (605) and the antenna match (627), which are at the same impedance values, can form a through path utilizing a FET (620). There is no matching circuitry to change the impedance between the transmit circuitry (605) and the antenna match (627). As known in the art, such practice is commonly done for RF blocks. In such cases the RF blocks are designed to the impedance value of 50 ohms, which is a standard impedance value in RF design practices. This can also allow for testing of the individual RF blocks. In the example embodiment of FIG. 6A, the MOSFET switch (620) provides a low resistance path between the transmit circuitry (605) and the antenna match (627) when on, and a high resistance when off. This is combined with a low resistance to ground through MOSFET switch (615) when MOSFET switch (620) is off. MOSFET switch (615) is a high resistance when MOSFET switch (620) is a low resistance.

Figure 6B:
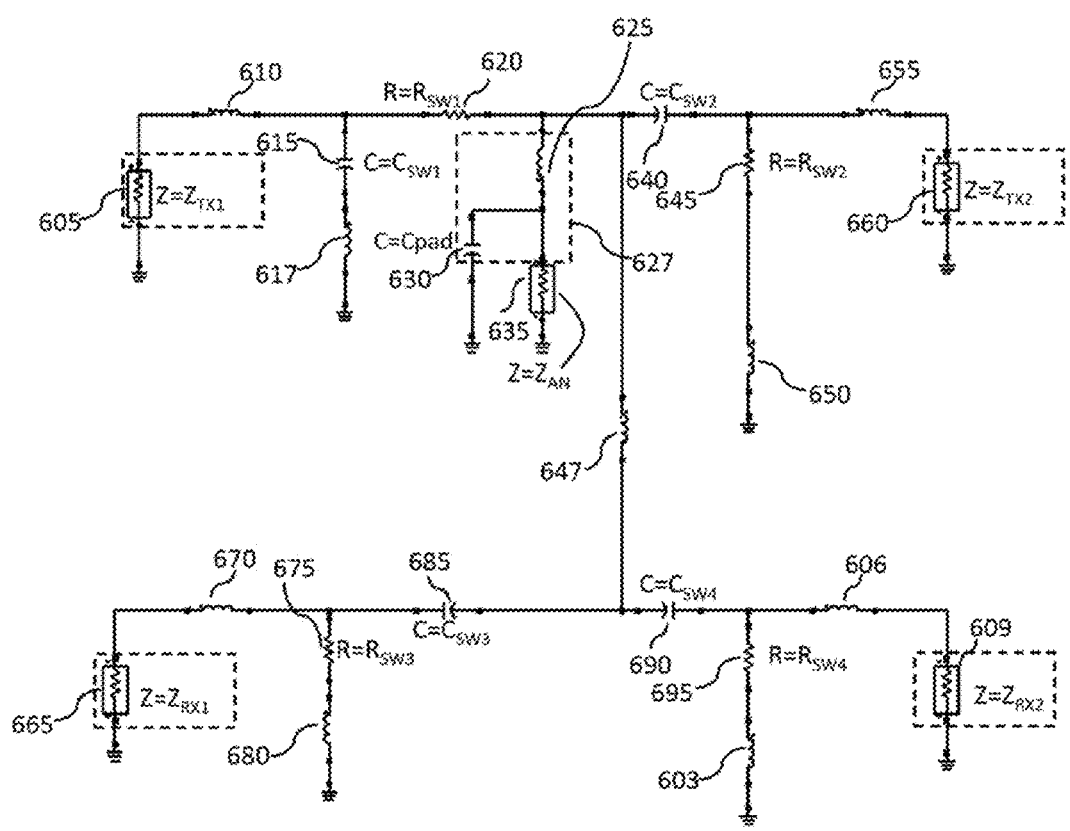
FIG. 6B represents the small signal equivalent circuit of FIG. 6A for transmit case when the first transmit circuitry (605) is transmitting through antenna (635).
Figure 6C:
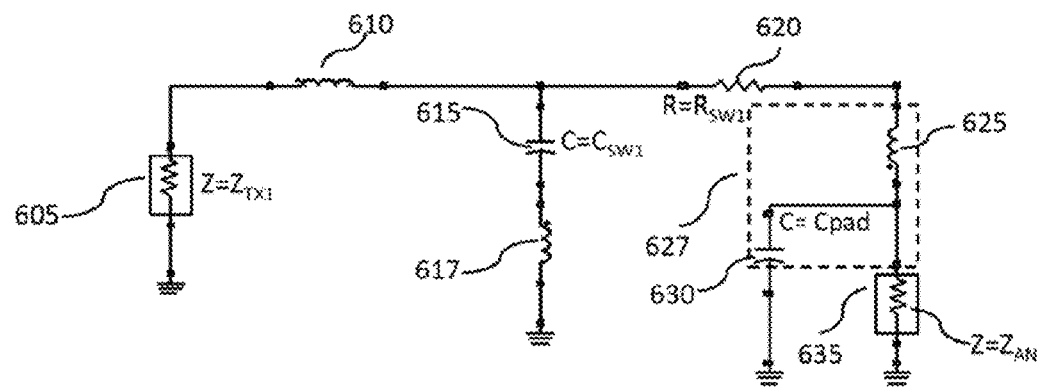
FIG. 6C shows the transmit path only for the particular case depicted by FIG. 6B.
Figure 6D:
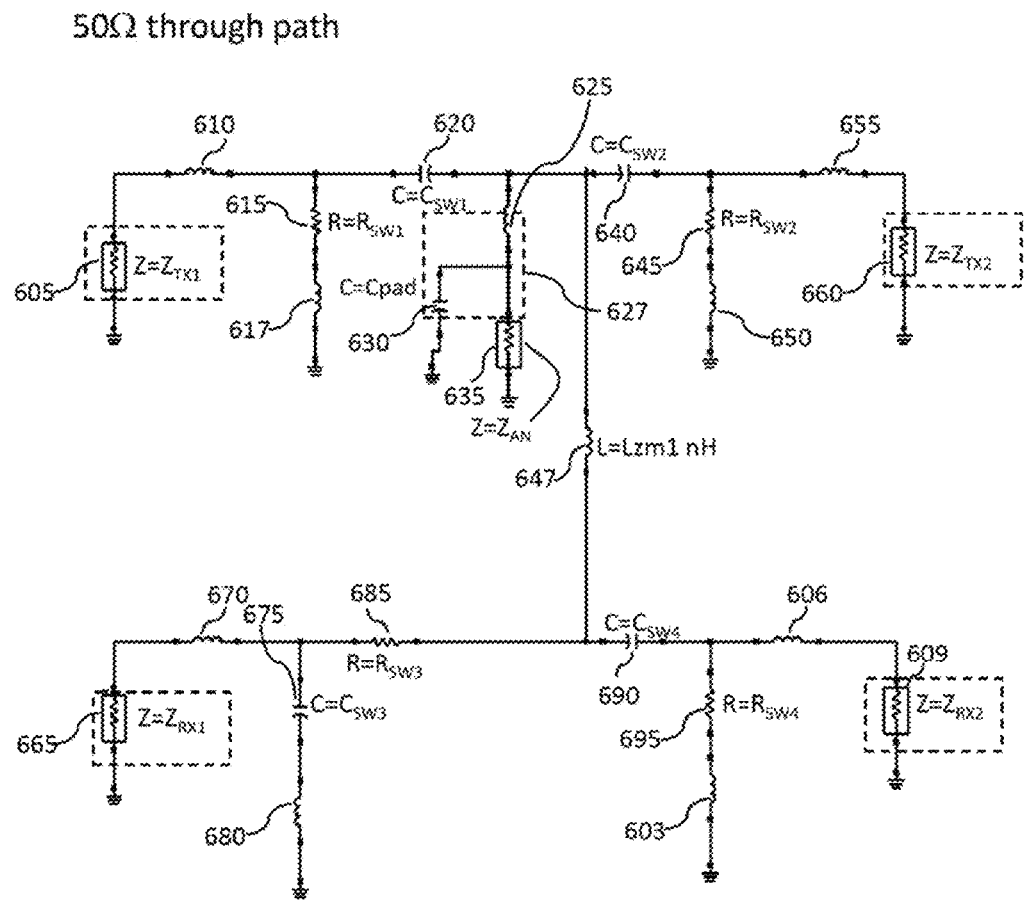
FIG. 6D represents the small signal equivalent circuit of FIG. 6A for receive case when the first receive circuitry (665) is receiving from antenna (635).
Figure 6E:
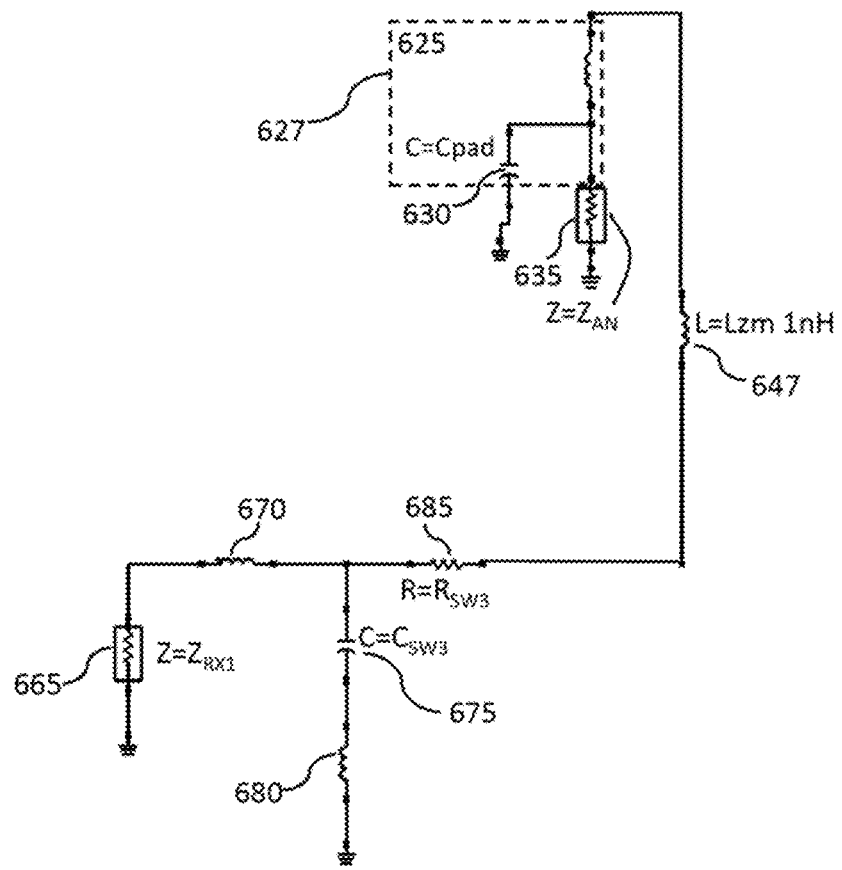
FIG. 6E shows the receive path only for the particular case depicted by FIG. 6D.
Figure 6F:
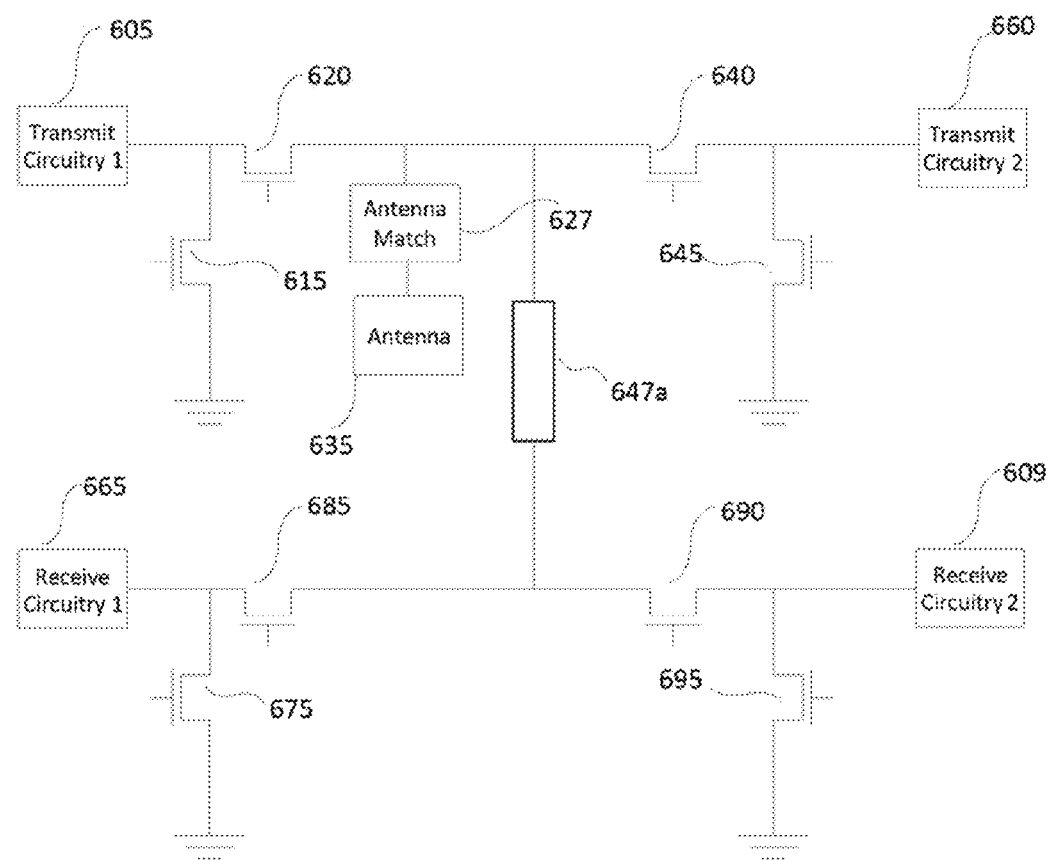
FIG. 6F shows a block diagram similar to one of FIG. 6A, wherein, instead of an inductor, a reactive network is used to match the impedance at the receive circuitries.

In accordance with the present disclosure, exemplary embodiment of FIG. 6B represents the small signal equivalent circuit of FIG. 6A for transmit case when the first transmit circuitry (605) is transmitting through antenna (635) and FIG. 6C shows that particular transmit path. Moreover, exemplary embodiment of FIG. 6D represents the small signal equivalent circuit of FIG. 6A for receive case when the first receive circuitry (665) is receiving from antenna (635), and FIG. 6E shows that particular receive path. In the exemplary embodiments of FIGS. 6B-6E, the MOSFET switches (615, 620, 640, 645, 675, 685, 690, 695), as shown in FIG. 6A have been replaced by equivalent circuit representations as shown in FIG. 4A. For example, switch (620) can be represented by a resistor when it is ON (FIGS. 6B-6C) or a capacitor when it is OFF (FIG. 6D-6E). In the exemplary embodiments of FIGS. 6B-6E impedance (635) represents an impedance of an antenna, capacitance (630) and inductance (625) represent the antenna match (627), impedance (605) represents impedance of the first transmit circuitry and impedance (665) represents impedance of the second receive circuitry.

Furthermore, in the exemplary embodiments of FIGS. 6B-6E, inductive elements (603, 606, 610, 617, 650, 655, 670, 680) have been assumed as parasitic inductances, for example, bond wire inductances, which can degrade circuit performance. As known in the art, an antenna switch comprising plurality of MOSFETs can be inherently a low-pass filter due to OFF capacitances of the OFF devices of the antenna switch in combination with parasitic resistances and inductances. Filtering inherent in the antenna switch can be gradual filtering that can affect bandwidth and insertion loss at a band edge (highest frequency of operation), but cannot provide enough attenuation to be used as a filter in place of filters (120) or (140) shown in FIG. 1A.

In the exemplary transmit case shown in FIGS. 6B-6C, when MOSFET switching arrangement of (620) and (615) are connecting the antenna match (627) to the first transmit circuitry (605), a first series switch in the ON state, as represented by equivalent resistor (620), can enable a connection between the first transmit circuitry (605) and the antenna match (627) and therefore the antenna (635). In this case, the first shunt switch (615) is in the OFF state, as represented by an equivalent capacitor ($C_{sw1}$). In this case, a signal from the first transmit circuitry (605) can be transmitted following the path: (605, 610, 620, 627, 635), which is shown in FIG. 6C. In the exemplary transmit case shown in FIG. 6C, the MOSFET switches (685, 690 and 640) are at high impedances or can act as open circuits. In FIG. 6B, the series MOSFET switches (685, 690) and (640) in the OFF state, as represented by equivalent capacitors, can disconnect or isolate the receive circuitries (665, 609), the inductor (647) and the second transmit circuitry (660), respectively, from the antenna match (627) and the antenna (635). The shunt MOSFET switches (675, 695) and (645) in the ON state, as represented by equivalent resistors, can be utilized as terminating loads for the receive circuitries (665, 609) and the second transmit circuitry (660), respectively.

In accordance with the present disclosure, in the receive case, as shown in the exemplary embodiment of FIGS. 6D-6E, when the antenna match (627) is connected to the first receive circuitry (665), the first series MOSFET switch (620) can be turned OFF (as represented by equivalent capacitor), while turning ON the second series MOSFET switch (685) (as represented by equivalent resistor). In such case, the second shunt MOSFET switch (675) can be turned OFF (as represented by an equivalent capacitor), since it is no longer needed to serve as a terminating load for the second receive circuitry (665) as in the transmit case. The first series MOSFET switch (620) being turned OFF can disconnect or isolate the first transmit circuitry (605) from rest of the network. The shunt switch (615) can be turned ON, as represented by equivalent resistor, to serve as a terminating load for the first transmit circuitry (605). Similar to transmit case, as described in FIGS. 6B-6C, in the exemplary receive case of FIGS. 6D-6E, the series MOSFET switches (690) and (640) in the OFF state (as represented by equivalent capacitors), can disconnect or isolate the second receive circuitry (609) and the second transmit circuitries (605, 660), respectively, from the antenna match (627) and the antenna (635). The shunt MOSFET switches (695), (615) and (645) in the ON state, as represented by equivalent resistors, can be utilized as terminating loads for the second receive circuitry (609) and the transmit circuitries (605 and 660), respectively.

In some embodiments, as mentioned previously, the impedance at the antenna match (627) can be lower (for example 30Ω) than the impedance at the receive circuitry (for example 50Ω). This differs from conventional antenna transmit receive arrangement that generally present a common system impedance (e.g. 50Ω) to all elements of the system. In the receive case, as shown in the exemplary embodiment of FIGS. 6D-6E, the series inductor (647) can be present in a signal path connecting the antenna (635) and the antenna match (627) to the first receive circuitry (665). The inductor (647) in combination with the $R_{ON}$ and $C_{OFF}$ of the FET and the parasitic components associated with the circuital arrangement, can match a first impedance (for example, 30Ω) at the antenna match (627) to a second impedance at the first receive circuitry (665). The $R_{ON}$ and $C_{OFF}$ of the FETs can be dependent on the respective FET size, which can be adjusted and optimized in the design process depending on the desired values of the first and second impedances at the antenna match (627) and the first receive circuitry (665), respectively. In the exemplary embodiments of FIGS. 6A-6E and FIG. 8, the inductor (647) is assumed as a fixed inductor. According to some embodiments of the present disclosure, inductor (647) can be a variable inductor, such as to allow fine tuning of the combined impedance that includes the inductor (647) with the $R_{ON}$ and $CO_{FF}$ of the FET and the parasitic components associated with the circuital arrangement. Moreover, in some embodiments, a fixed or variable (e.g. tunable) capacitance in series connection (not shown in the FIGS. 6A and 8) with the inductor (647) can be used such as to allow further flexibility in providing an impedance value used within the switch. More information regarding tunable reactive elements, including digitally unable capacitors (DTCs) and digitally tunable inductors (DTLs), may be found, for example, in International Application No. PCT/US2009/001358, entitled "Method and Apparatus for Use in Digitally Tuning a Capacitor in an Integrated Circuit Device," filed on Mar. 2, 2009, and in U.S. patent application Ser. No. 13/595,893 entitled "Method and Apparatus for Use in Tuning Reactance in an Integrated Circuit Device", filed on Aug. 27, 2012, both incorporated herein by reference in their entirety.

Figure 7:
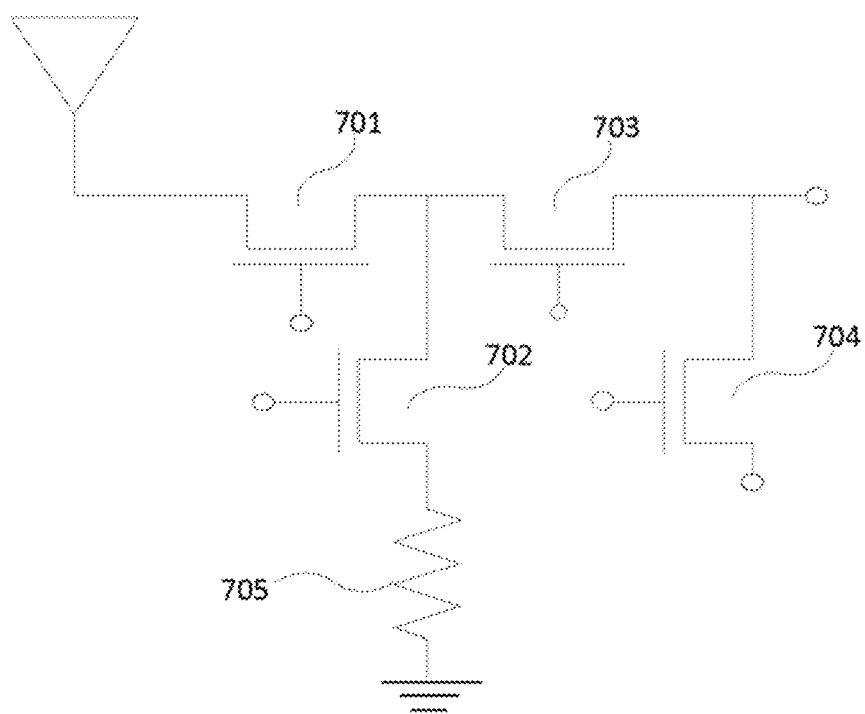
FIG. 7 shows an example where each series FET in pair with a shunt FET in FIGS. 6A, 6B and 6C can be replaced with a series switch in pair with a shunt switch followed by another series switch in pair with a shunt switch.

In the exemplary antenna transmit receive arrangement of FIGS. 6A-6E, each combination of series switch paired with a shunt switch (e.g. series FET (620) in pair with shunt FET (615), series FET (640) in pair with shunt FET (645) etc.) can be replaced with a series switch in pair with a shunt switch followed by another series switch in pair with a shunt switch. This series shunt combination of switches is shown in the exemplary embodiment of FIG. 7. The exemplary embodiment of FIG. 7 shows a switch combination comprising a series switch (701) in pair with a shunt switch (702) followed by another series switch (703) in pair with a shunt switch (704), which can replace each series shunt combination of switches in FIGS. 6A-6E. In such cases, addition of additional series switch and shunt switch pairs can improve isolation. A resistor (705) can be added at a terminal of the first shunt FET (702) and/or the second shunt FET (704) in order to further improve the system isolation. The resistor (705) can dissipate power as supposed to just reflecting power, thus providing better isolation. Additional series and shunt FET pairs can be added in order to further improve isolation. However, each series and shunt FET pair can also introduce its own insertion loss. Each MOSFET switch of FIGS. 6A-6E can also comprise stack of MOSFET switches as depicted in FIG. 4B (for instance, in order to withstand higher power transmitted or received signals).

According to some embodiments of the present disclosure, stack height of such switches can also be used to control (e.g. vary) impedances presented at the various ports of the switch (e.g. receive, transmit), as the stack height directly influences the equivalent Ron and Coff values of the switch.

Figure 8:
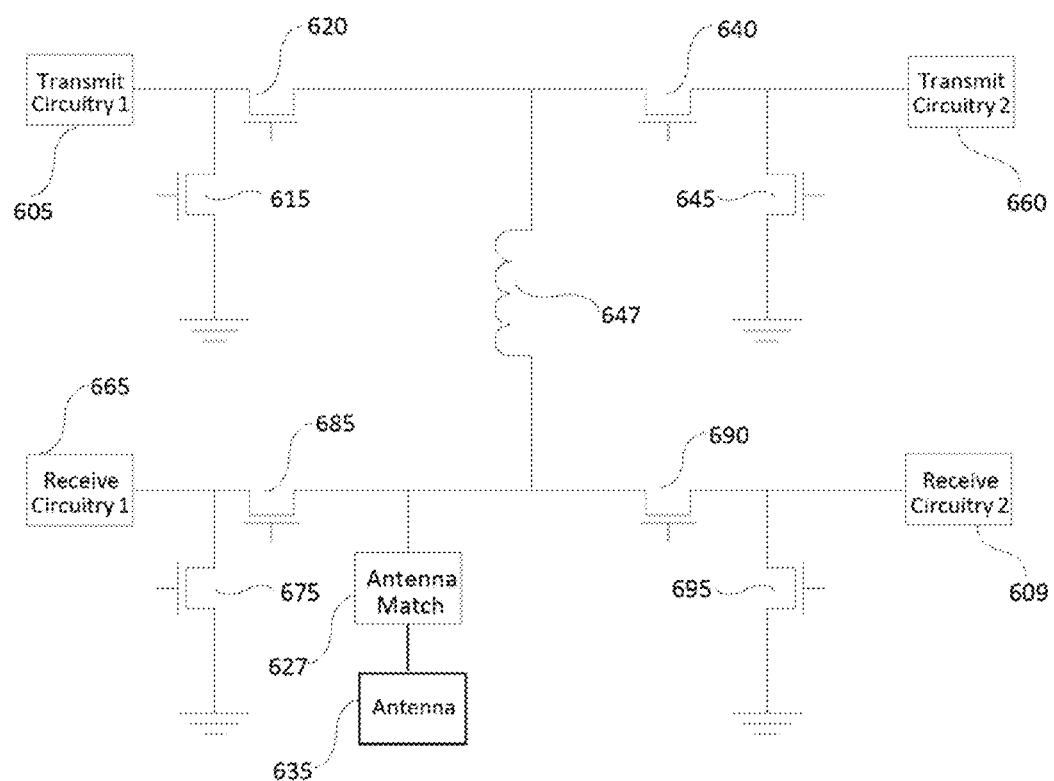
FIG. 8 shows a block diagram representation of an exemplary antenna transmit receive arrangement in case the impedance value of an antenna match is higher (e.g. 200Ω) than the impedance of receive circuitry.

As indicated previously, the exemplary embodiments of FIGS. 6A-6F are discussed assuming that the impedance at the antenna match and the transmit circuitry are at similar value, which is lower than the impedance at the receive circuitry. The exemplary embodiment of FIG. 8 represents a block diagram representation of an exemplary antenna transmit receive arrangement in case the antenna match (627) and the receive circuitries (665 and 609) are at similar impedance value and impedance he transmit circuitries are higher impedance than the antenna and the receive circuitries. In this case, as shown in the exemplary embodiment of FIG. 8, in contrast to the arrangements of FIGS. 6A-6E where the antenna match (627) and antenna (635) are connected to transmit circuitries (605,660), the antenna match (627) and antenna (635) are connected at to receive circuitries (609,665). As in the case of the embodiment presented in the FIGS. 6A and 6F, the inductor (647) may be replaced with a reactive network (e.g. 647a of FIG. 6F) comprising a combination of series and/or shunt connected reactive elements. In order to facilitate tuning of the circuital arrangement presented in FIG. 8, the inductor (647) can be a DTL and said reactive network (e.g. equivalent to 647a of FIG. 6F) may comprise one or more DTC and/or DTL.

Figure 9:
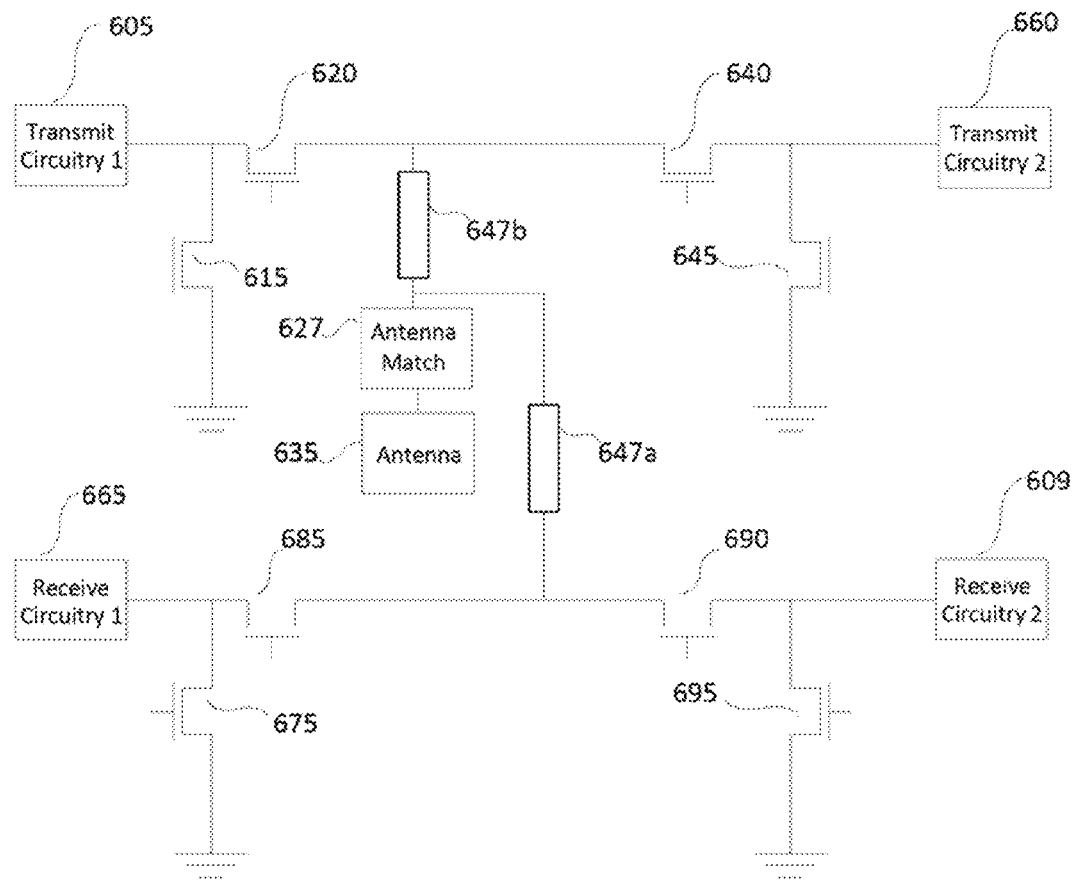
FIG. 9 shows a block diagram representation of an exemplary antenna transmit receive arrangement with a plurality of transmits and receives, wherein two reactive elements are used to each match the impedance at the receive and at the transmit circuitries.

Although throughout the various exemplary embodiments of the present disclosure discussed to this point one of the transmit or receive circuitries are assumed to have a same impedance as the antenna match, the skilled person will readily realize that teachings presented in these embodiments can be extended to the case where both the transmit and receive circuitries have different impedances from the antenna match. The embodiment presented in FIG. 9 depicts such case, where a second impedance matching network (647b) is used to match the impedance of the transmit circuitries to the impedance of the antenna match (627). Impedance matching network (647b) of FIG. 9 has similar function as the impedance match network (647a) used in the receive circuitry path. In the exemplary embodiment of FIG. 9 it is assumed that both the transmit and receive circuitries have higher impedances than the antenna match. The skilled person will know how to use the teachings of the embodiment presented in FIG. 9 to tailor the switch for various impedance values of the transmit, receive and antenna match circuitries.

The teachings according to the various embodiments of the present disclosure have thus far been applied to switching of circuitries associated to a transmission or a reception of an RF signal through an antenna match circuitry. Although such configuration is typical to many data communication systems, such as hand held cellular phones, PDAs, tablets and the like, in some configurations, it may be desirable to switch and match circuitries associated to, for example, duplex communication channels. Duplex communication channels are used, for example, in frequency division duplex systems like Wideband Code Division Multiple Access (WCDMA) systems. In such systems, a same conduction path can be used to both transmit and receive a signal at two different instants in time.

Figure 10:
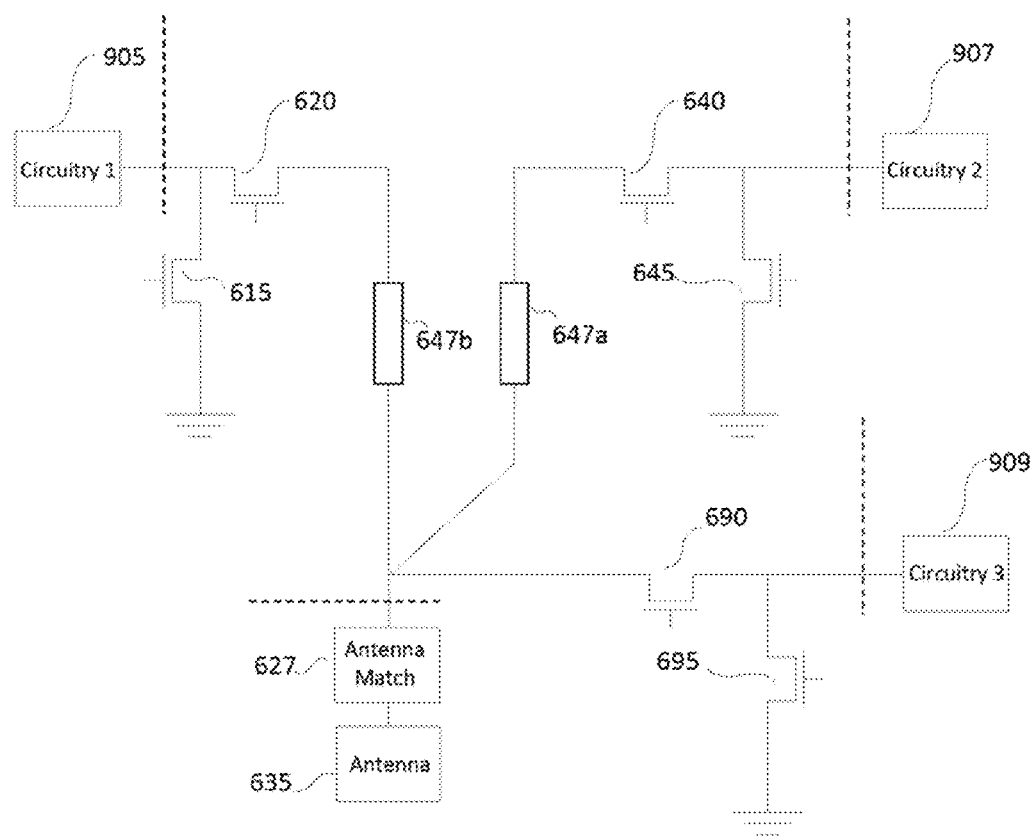
FIG. 10 shows a block diagram representation of an exemplary switch with a plurality (three) of transmit and/or receive paths, wherein some (two) paths include impedance matching reactive elements and others (one) do not include an impedance matching reactive element.

According to an embodiment of the present disclosure, FIG. 10 shows a block diagram representation of an exemplary switch (e.g. within dotted lines) with a plurality (three) of generic communication paths, wherein some (e.g. two) communication paths include impedance matching reactive elements (647a, 647b) and other (e.g. one) communication paths do not include an impedance matching reactive element. Communication paths presented in FIG. 10 can be associated to circuitries (1, 2, 3), wherein each circuitry can be a transmit, a receive or a duplex transmit and receive circuit. The exemplary switch represented by FIG. 10 switches circuitry 1 (905) such as to provide a conduction path through the antenna match (627) via an impedance match network (647b). In a similar fashion, the switch represented by FIG. 10 switches circuitry 2 (907) such as to provide a conduction path through the antenna match (627) via an impedance match network (647a) which can be different from the impedance match network (647b). Finally, the switch represented by FIG. 10 switches circuitry 3 (909) such as to provide a conduction path through the antenna which is devoid of an impedance match network. The skilled person will know that each of the conduction paths created by the various internal transistor switches (615, 620, 640, 645, 690, 695) and the impedance match networks (647a, 647b) of the switch can be used, at any given time, to either transmit or receive a signal to or from the antenna (635), via the antenna match circuit (627). Although the switch represented in FIG. 10 shows three generic communication channels (e.g. each associated to each circuitry), of which two include impedance match networks, the skilled person will realize that such configuration can be expanded to any number of communication channels, each with the ability to include or to not include an impedance match network, dependent on the desired system requirements.

Although FETs (e.g. MOSFETs) are used to describe the various transistor (e.g. switch) embodiments in the present disclosure, a person skilled in the art would recognize that either P-type or N-type MOSFETs may be used. The skilled person would also recognize that other types of transistors such as, for example, bipolar junction transistors (BJTs) can be used instead or in combination with the N-type or P-type MOSFETs. Furthermore, a person skilled in the art will also appreciate the advantage of stacking more than two transistors, such as three, four, five or more, provide on the voltage handling performance of a switch. This can for example be achieved when using non bulk-Silicon technology, such as insulated Silicon on Sapphire (SOS) technology and silicon on insulated (SOI) technology. In general, individual devices in the various presented arrangements can be constructed using CMOS, silicon germanium (SiGe), gallium arsenide (GaAs), gallium nitride (GaN), bipolar transistors, or any other viable semiconductor technology and architecture known. Additionally, different device sizes and types can be used within the stacked transistors of the various switches such as to accommodate various current handling capabilities of the switches as well as equivalent impedances.

According to further embodiments of the present disclosure, monolithic integration of any of the presented arrangements using a process such as CMOS, CMOS SOI, or CMOS SOS is provided. Benefits of SOI and SOS processes include lower parasitic capacitance and thus higher linearity for stacked switches and transistors implemented using such processes, as well as high transistor stack capability (e.g. 3, 4 or greater) and higher breakdown voltages for larger voltage swings. Additional benefits of the SOI and SOS processes are lack of p-n junction diode which allows for better output linearity over a wider output signal range. Although in some embodiment full monolithic integration is performed, according to further embodiments of the present disclosure, partial monolithic integration may be performed, wherein for example some components of the various arrangements disclosed are not monolithically integrated. The skilled person can envision multitude ways of partitioning the arrangements according to the present embodiments for integration purposes and as fit by certain desired design criteria, while keeping the benefits of the presented embodiments.

The examples set forth above are provided to give those of ordinary skill in the art a complete disclosure and description of how to make and use the embodiments of the antenna transmit receive switch of the present disclosure, and are not intended to limit the scope of what the inventor regard as his disclosure. Modifications of the above-described modes for carrying out the disclosure can be used by persons of skill in the art, and are intended to be within the scope of the following claims. All patents and publications mentioned in the specification can be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

What is claimed is:

1. A circuital arrangement comprising:
a first port;
a second port;
a third port;
a first transistor arrangement;
a second transistor arrangement; and a first reactive element,
wherein:
the circuital arrangement is configured to operate in one of a first mode and a second mode of operation, a mode of operation being determined by a control signal,
during the first mode of operation, the circuital arrangement is configured to present a first impedance at the first port and a second impedance at the second port and to provide a first electrical conduction path between the second port and the first port through the first transistor arrangement, while isolating the third port from the first electrical conduction path,
during the second mode of operation, the circuital arrangement is configured to present the first impedance at the first port and a third impedance different from the first impedance and the second impedance at the third port and provide a second electrical conduction path between the third port and the first port through the second transistor arrangement connected in series with the first reactive element, while isolating the second port from the second electrical conduction path, and
the first impedance and the second impedance are lower in value than the third impedance.

2. The circuital arrangement according to claim 1, wherein the first electrical conduction path further comprises a second reactive element connected in series with the first transistor arrangement.

3. The circuital arrangement according to claim 2, further comprising a control unit configured to generate the control signal.

4. The circuital arrangement according to claim 2, wherein:
the first transistor arrangement comprises one or more first shunt transistor each connected to a corresponding one or more first series transistor and the second transistor arrangement comprises one or more second shunt transistor each connected to a corresponding one or more second series transistor, wherein:
during the first mode of operation, the one or more first series transistor and the one or more second shunt transistor are ON and the one or more first shunt transistor and the one or more second series transistor are OFF; and
during the second mode of operation, the one or more first series transistor and the one or more second shunt transistor are OFF and the one or more first shunt transistor and the one or more second series transistor are ON.

5. The circuital arrangement according to claim 4 wherein a port of a shunt transistor of the one or more first shunt transistor and/or the one or more second shunt transistor is connected to ground via a resistor.

6. The circuital arrangement according to claim 4, wherein the transistors of the first and second transistor arrangements are MOSFETs.

7. The circuital arrangement according to claim 4, wherein a transistor of the first and/or the second transistor arrangements is an accumulated charge control (ACC) silicon on insulator (SOI) metal-oxide-semiconductor field-effect transistor (MOSFET).

8. The circuital arrangement according to claim 4, wherein a transistor of the first or the second transistor arrangements is a stacked transistor.

9. The circuital arrangement according to claim 8, wherein a stack height of the stacked transistor is a function of an impedance value of the first impedance and/or the second impedance and/or the third impedance.

10. The circuital arrangement according to claim 9, wherein the function is a ratio of impedance values.

11. The circuital arrangement according to claim 9, wherein the stack height of a transistor of the first transistor arrangement is a ratio of a value of the first impedance and a value of the second impedance.

12. The circuital arrangement according to claim 9, wherein the stack height of a transistor of the second transistor arrangement is a ratio of a value of the first impedance and a value of the third impedance.

13. The circuital arrangement according to claim 2, wherein the first and/or the second reactive element comprises: a) an inductor with a fixed inductance, b) an inductor with a variable inductance, c) a capacitor with a fixed capacitance in series connection with a) or b), and d) a capacitor with a variable capacitance in series connection with a) or b).

14. The circuital arrangement according to claim 13, wherein the variable inductor is a digitally tunable inductor (DTL) and/or the variable capacitor is a digitally tunable capacitor (DTC).

15. The circuital arrangement according to claim 2, wherein the first and/or the second reactive element comprises a combination of series and/or shunt connected reactive elements.

16. The circuital arrangement according to claim 15, wherein at least one reactive element of the combination of series and/or shunt connected reactive elements comprises a digitally tunable inductor (DTL) and/or a digitally tunable capacitor (DTC).

17. The circuital arrangement according to claim 2, wherein the first impedance, the second impedance and the third impedance are determined by $R_{ON}$ and $C_{OFF}$ of the transistors from the first and second transistor arrangements in combination with the reactances of the first reactive element, the second reactive element and parasitic components associated with the circuital arrangement.

18. The circuital arrangement according to claim 17, wherein the $R_{ON}$ and $C_{OFF}$ of the transistors from the first and second transistor arrangements are varied to achieve a desired first, second and third impedance.

19. The circuital arrangement according to 18, wherein the $R_{ON}$ and $C_{OFF}$ are varied by changing sizes of the transistors from the first and second transistor arrangement.

20. The circuital arrangement according to claim 2, wherein the values of the first impedance, the second impedance and the third impedance are varied by varying the sizes of the transistors from the first and second transistor arrangements in combination with a value of the first reactive element and the second reactive element.

21. The circuital arrangement according to claim 2, wherein the first impedance is lower in value than the second impedance.

22. The circuital arrangement according to claim 1 or 2, fabricated in the form of an integrated circuit.

23. The circuital arrangement according to claim 1 or 2, fabricated entirely or partially using one of a) silicon on insulator (SOI) technology, and b) silicon on sapphire (SOS) technology.

24. The circuital arrangement according to claim 1 or 2, further comprising:
a first impedance matching network;
a lowpass filter connected between the first impedance matching network and the second port;
a bandpass filter connected to the third port;
an antenna; and
a second impedance matching network connected between the first port and the antenna.

25. The circuital arrangement according to claim 24, wherein the first impedance matching network is further connected to a transmit circuitry through a first power amplifier and the bandpass filter is further connected to a receive circuitry through a low noise amplifier.

26. The circuital arrangement according to claim 25, wherein the first impedance matching network matches an impedance between the first power amplifier and the low pass filter and the second impedance matching network matches an impedance between the first port and the antenna.

27. The circuital arrangement according to claim 1, wherein the first impedance and the second impedance are lower than 20Ω and the third impedance is 50Ω.

28. The circuital arrangement according to claim 27, wherein the first impedance is 2Ω and the second impedance is between 10 and 20Ω.

29. A circuital arrangement comprising:
one or more first ports;
one or more second ports;
one or more third ports;
one or more first transistor arrangements;
one or more second transistor arrangements; and
one or more first reactive elements,
wherein:
the circuital arrangement is configured to operate in one or both of a first mode and a second mode of operation,
during the first mode of operation, the circuital arrangement is configured to present a first impedance at a selected first port from among the one or more first ports and a second impedance at a selected second port from among the one or more second ports, and provide a first electrical conduction path between the selected second port and the selected first port through a first transistor arrangement of the one or more first transistor arrangements, while isolating the one or more third port and the unselected one or more first and second port from the first electrical conduction path,
during the second mode of operation, the circuital arrangement is configured to present the first impedance at a selected first port from among the one or more first ports and a third impedance at a selected third port from among the one or more third ports, and provide a second electrical conduction path between the selected third port and the selected first port through a second transistor arrangement of the one or more second transistor arrangements connected in series with a corresponding first reactive element of the one or more first reactive elements, while isolating the one or more second port and the unselected one or more first and third port from the second electrical conduction path, the first impedance and the second impedance being lower in value than the third impedance, and
the first or second modes of operation and the selected first port among the one or more first ports, the selected second port among the one or more second ports and the selected third port among the one or more third ports are configured to be selected by a control signal generated from a control unit.

30. A communication system comprising the circuital arrangement of claim 29, wherein the communication system is configured to operate in a plurality of selectable communication modes, each communication mode being in correspondence of the first mode of operation or the second mode of operation of the circuital arrangement.

31. The communication system according to claim 30, wherein a communication mode of the plurality of communication modes is in correspondence of one of a) a transmit channel, b) a receive channel, and c) a transmit and receive channel.

32. The circuital arrangement according to claim 29, wherein the first electrical conduction path further comprises a second reactive element connected in series with the first transistor arrangement.

33. The circuital arrangement according to claim 32, wherein the first impedance, the second impedance and the third impedance are determined by $R_{oN}$ and $C_{OFF}$ of the transistors from the selected first and selected second transistor arrangements in combination with the reactances of the first reactive element, the second reactive element and parasitic components associated with the circuital arrangement.

34. The circuital arrangement according to claim 32, wherein:
the selected first transistor arrangement comprises one or more first shunt transistor each connected to a corresponding one or more first series transistor and the selected second transistor arrangement comprises one or more second shunt transistor each connected to a corresponding one or more second series transistor, wherein:
during the first mode of operation, the one or more first series transistor and the one or more second shunt transistor are ON and the one or more first shunt transistor and the one or more second series transistor are OFF; and
during the second mode of operation, the one or more first series transistor and the one or more second shunt transistor are OFF and the one or more first shunt transistor and the one or more second series transistor are ON.

35. The circuital arrangement according to claim 34 wherein a port of a shunt transistor of the one or more first shunt transistor and/or the one or more second shunt transistor is connected to ground via a resistor.

36. The circuital arrangement according to claim 32, wherein the first and/or second reactive element comprises a combination of series and/or shunt connected reactive elements.

37. The circuital arrangement according to claim 36, wherein at least one reactive element of the combination of series and/or shunt connected reactive elements comprises a digitally tunable inductor (DTL) and/or a digitally tunable capacitor (DTC).

38. The circuital arrangement according to claim 29 or claim 30, wherein one or more transistors of the first and second transistor arrangements are MOSFETs.

39. The circuital arrangement according to claim 29 or claim 30, wherein a transistor of the first and/or the second transistor arrangements is an accumulated charge control (ACC) silicon on insulator (SOI) metal-oxide-semiconductor field-effect transistor (MOSFET).

40. The circuital arrangement according to claim 29, wherein a transistor of the first or the second transistor arrangements is a stacked transistor.

41. The circuital arrangement according to claim 40, wherein a stack height of the stacked transistor is a function of an impedance value of the first impedance and/or the second impedance and/or the third impedance.

42. The circuital arrangement according to claim 40, wherein the stack height of a transistor of the first transistor arrangement is a ratio of a value of the first impedance and a value of the second impedance.

43. The circuital arrangement according to claim 40, wherein the stack height of a transistor of the second transistor arrangement is a ratio of a value of the first impedance and a value of the third impedance.

44. The circuital arrangement according to 29, wherein the first impedance is lower in value than the second impedance.

45. The circuital arrangement according to claim 29, fabricated in the form of an integrated circuit.

46. The circuital arrangement according to claim 29, fabricated entirely or partially using one of: a) silicon on insulator (SOI) technology, and b) silicon on sapphire (SOS) technology.

47. The circuital arrangement according to claim 29, wherein the first impedance and the second impedance are lower than 20Ω and the third impedance is 50Ω.

48. The circuital arrangement according to claim 47, wherein the first impedance is 2Ω and the second impedance is between 10 and 20Ω.

49. A method for reducing loss in a radio frequency (RF) circuit, the method comprising:
during a first RF signal flow, providing a first conduction path between a corresponding first circuit and an antenna match circuit while isolating a second circuit from the first conduction path;
during a second RF signal flow, providing a second conduction path between the corresponding second circuit and the antenna match circuit while isolating the first circuit from the second conduction path;
based on the providing of the first conduction path, presenting a first impedance to both the first circuit and the antenna match circuit, and
based on the providing of the second conduction path, presenting a second impedance to the second circuit and the first impedance to the antenna match circuit, wherein the first impedance value is smaller than the second impedance value.

50. The method according to claim 49, wherein a difference in value between the first impedance value and the second impedance value is provided by an inductor in the second conduction path.

51. The method according to claim 49, wherein the first circuit is a transmit circuit transmitting the first RF signal and the second circuit is a receive circuit receiving the second RF signal.

52. The method according to claim 49, wherein the first circuit is a first transmit circuit transmitting the first RF signal and the second circuit is a second transmit circuit transmitting the second RF signal.

53. The method according to claim 49, wherein the first impedance and the second impedance are lower than 20Ω and the third impedance is 50Ω.

54. The method according to claim 51, wherein the first impedance is 2Ω and the second impedance is between 10 and 20Ω.

* * * * *